US009232626B2

(12) United States Patent
Sears (10) Patent No.: US 9,232,626 B2
(45) Date of Patent: Jan. 5, 2016

(54) WAFER GROUNDING USING LOCALIZED PLASMA SOURCE

(71) Applicant: KLA-Tencor Corporation, Milpitas, CA (US)

(72) Inventor: Christopher Sears, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/527,301

(22) Filed: Oct. 29, 2014

(65) Prior Publication Data

US 2015/0123542 A1    May 7, 2015

Related U.S. Application Data

(60) Provisional application No. 61/899,412, filed on Nov. 4, 2013.

(51) Int. Cl.
| | |
|---|---|
| *H01J 7/24* | (2006.01) |
| *H05B 31/26* | (2006.01) |
| *H05H 1/46* | (2006.01) |
| *H01L 21/683* | (2006.01) |
| *H05H 1/48* | (2006.01) |
| *H01J 37/32* | (2006.01) |

(52) U.S. Cl.
CPC ............ *H05H 1/46* (2013.01); *H01J 37/32091* (2013.01); *H01J 37/32532* (2013.01); *H01J 37/32541* (2013.01); *H01L 21/683* (2013.01); *H05H 1/48* (2013.01); *H05H 2001/483* (2013.01)

(58) Field of Classification Search
None
See application file for complete search history.

(56) References Cited

U.S. PATENT DOCUMENTS

| 5,432,315 A | 7/1995 | Kaji et al. |
| 5,460,684 A | 10/1995 | Saeki et al. |
| 5,491,603 A | 2/1996 | Birang et al. |
| 5,542,559 A | 8/1996 | Kawakami et al. |

(Continued)

FOREIGN PATENT DOCUMENTS

| JP | 2002-270682 A | 9/2002 |
| KR | 10-2010-0004857 A | 1/2010 |
| WO | 2008082923 A2 | 7/2008 |

OTHER PUBLICATIONS

Berliner Glass group, Wafer Chucks for Lithography, Semicon Europa 2011, Found online at: http://semieurope.omnibooksonline.com/2011/semicon_europa/SEMI_TechARENA_presentations/lithographysession_07_Sven.Goetze_BerlinerGlas.pdf.

*Primary Examiner* — Anh Tran
(74) *Attorney, Agent, or Firm* — Suiter Swantz pc llo (57) ABSTRACT

An apparatus may include a substrate support portion, a plasma generation chamber, electrodes, and a power source. The substrate support portion supports a substrate including an insulating layer and a substrate bulk. The plasma generation chamber may include chamber wall portions, a gas port, and a plasma application aperture and is configured to contain a gas. The plasma application aperture may be covered by a portion of the substrate. Each electrode may protrude into or extend into an interior portion of the plasma generation chamber. The power source may be coupled to a particular electrode, and the power source may be configured to apply a voltage to the particular electrode. Application of the voltage to the particular electrode generates a plasma within the plasma generation chamber, whereby generation of the plasma results in a conductive path through the insulating layer of the substrate between the plasma and the substrate bulk.

35 Claims, 7 Drawing Sheets

(56) References Cited

U.S. PATENT DOCUMENTS

| | | |
|---|---|---|
| 5,790,365 A | 8/1998 | Shel |
| 5,874,361 A | 2/1999 | Collins et al. |
| 6,033,482 A | 3/2000 | Parkhe |
| 6,099,697 A | 8/2000 | Hausmann |
| 6,174,370 B1 | 1/2001 | Yoshida |
| 6,246,567 B1 | 6/2001 | Parkhe |
| 6,304,424 B1 | 10/2001 | Mett et al. |
| 6,511,577 B1 | 1/2003 | Johnson |
| 6,624,084 B2 | 9/2003 | Maeda et al. |
| 6,793,767 B2 | 9/2004 | Chu et al. |
| 6,867,144 B2 | 3/2005 | Ohmoto et al. |
| 7,347,915 B1 | 3/2008 | Keil et al. |
| 7,884,025 B2 | 2/2011 | Collins et al. |
| 8,094,428 B2 | 1/2012 | Wang et al. |
| 2004/0159287 A1 | 8/2004 | Hoffman et al. |
| 2008/0020562 A1 | 1/2008 | Soda |
| 2010/0110603 A1 | 5/2010 | LaFontaine et al. |
| 2012/0115257 A1 | 5/2012 | Matsuyama et al. |
| 2012/0298879 A1* | 11/2012 | Plettner et al. ............ 250/396 R |
| 2013/0220549 A1 | 8/2013 | Wilson |
| 2013/0306240 A1 | 11/2013 | Ni et al. |

* cited by examiner

WAFER GROUNDING USING LOCALIZED PLASMA SOURCE

CROSS-REFERENCE TO RELATED APPLICATIONS

The present application claims the benefit under 35 U.S.C. §119(e) of U.S. Provisional Application Ser. No. 61/899,412, filed Nov. 4, 2013. U.S. Provisional Application Ser. No. 61/899,412 is herein incorporated by reference in its entirety.

FIELD

Embodiments are directed generally toward a method, circuit, apparatus, and system for performing non-destructive wafer grounding by utilizing a plasma source.

BACKGROUND

Currently, a sharp pin of a tool is used to mechanically puncture a backside oxide layer of a wafer in order to provide a ground path. The current methodology, however, damages the wafer and creates particles that can damage the tool and other wafers. Such problems have long faced electron beam and wafer applications. Therefore, it would be desirable to provide a non-destructive method for grounding wafers.

SUMMARY

Accordingly, an embodiment includes an apparatus. The apparatus may include a substrate support portion configured to support a substrate including at least one insulating layer and a substrate bulk. The apparatus may further include a plasma generation chamber. The plasma generation chamber may include chamber wall portions, at least one gas port, and a plasma application aperture. The plasma application aperture may be configured to be covered by a portion of the substrate upon a deposition of the substrate on the substrate support portion. The plasma generation chamber is configured to contain a gas. The apparatus may include at least two electrodes including a first electrode and a second electrode. Each of the at least two electrodes may protrude into or extend into an interior portion of the plasma generation chamber. The apparatus may also include at least one power source including at least a first power source. The first power source may be coupled to a particular electrode of the at least two electrodes, and the first power source may be configured to apply a voltage to the particular electrode of the at least two electrodes. Application of the voltage to the particular electrode generates a plasma within the plasma generation chamber, whereby generation of the plasma results in a conductive path through the insulating layer of the substrate between the plasma and the substrate bulk.

Additional embodiments are described in the application including the claims. It is to be understood that both the foregoing general description and the following detailed description are exemplary and explanatory only and are not restrictive. Other embodiments will become apparent.

BRIEF DESCRIPTION OF THE FIGURES

Other embodiments of the invention will become apparent by reference to the accompanying figures in which.

DETAILED DESCRIPTION

Reference will now be made in detail to the subject matter disclosed, which is illustrated in the accompanying drawings. The scope of the invention is limited only by the claims; numerous alternatives, modifications, and equivalents are encompassed. For the purpose of clarity, technical material that is known in the technical fields related to the embodiments has not been described in detail to avoid unnecessarily obscuring the description.

Referring generally to FIG. 1A-4, a method, apparatus, software or firmware, at least one circuit, and/or system for providing (e.g., creating, forming, or the like) a non-destructive conductive path through an insulating layer of a substrate between a substrate bulk and a substrate tool via plasma is described. In some embodiments, a voltage is applied to a particular electrode of at least two electrodes of a plasma generation chamber filled with a low pressure gas (e.g., argon). Application of the voltage to the particular electrode may create a high electric field between a gap between the at least two electrodes. The high electric field between the gap may ionize some of the gas and may induce a breakdown, which leads to a large current flow and creates a plasma. In some embodiments, one or more of the at least two electrodes may be pointed (e.g., having a pointed tip, a chisel-shaped tip, or the like) to lower a breakdown threshold. In some embodiments, one or more of the at least two electrodes may be non-pointed (e.g., having a rounded tip, a square tip, or the like). The created plasma generates a wide spectrum of light emission, which may, for example, extend into the deep ultraviolet (DUV) range. In some embodiments, deep ultraviolet photons may hit the insulating layer (e.g., backside oxide) of the substrate (e.g., a wafer) and may create charge carriers, which may form a conductive path through the insulating layer from the substrate bulk to the plasma generation chamber-side of the insulating layer. Additionally, the plasma electrons and/or ions may carry current from the surface (e.g., of the plasma generation chamber-side) of the insulating layer to a surrounding portion of the substrate tool (e.g., a chuck), thus providing a low resistance path to hold the substrate bulk voltage constant.

In some embodiments, the plasma within the plasma generation chamber is created by a thermionic cathode, laser ignition, or the like. In some embodiments, the gas within the plasma generation chamber may include any suitable gas or suitable mixture of gases; for example, the gas may include one or a combination of at least one inert gas (e.g., noble gas or non-noble inert gas) and at least one non-inert gas (e.g., mercury). For example, it is anticipated herein that the volume of gas used to generate a plasma may include, but is not limited to, argon. In one embodiment, the gas may include a substantially pure argon gas held at pressure of approximately 0.05 millibars (mbar) (e.g., between 0.01 mbar and 0.20 mbar). In another embodiment, the gas may include a mixture of argon gas with an additional gas. It is further noted that some embodiments may be extended to include a number of gases. For example, gases suitable for implementation in the present disclosure may include, but are not limited to, Xe, Ar, Ne, Kr, He, $N_2$, $H_2O$, $O_2$, $H_2$, $D_2$, $F_2$, $CH_4$, $CF_4$, $CHF_3$, $C_2F_6$, $CH_2F_2$, $SF_6$, one or more metal halides, a halogen, Hg, Cd, Zn, Sn, Ga, Fe, Li, Na, ArXe, ArHg, KrHg, XeHg, and the like. In a general sense, the present disclosure should be interpreted to extend to any plasma generating system and should further be interpreted to extend to any type of gas suitable for sustaining a plasma.

Figure 1A:
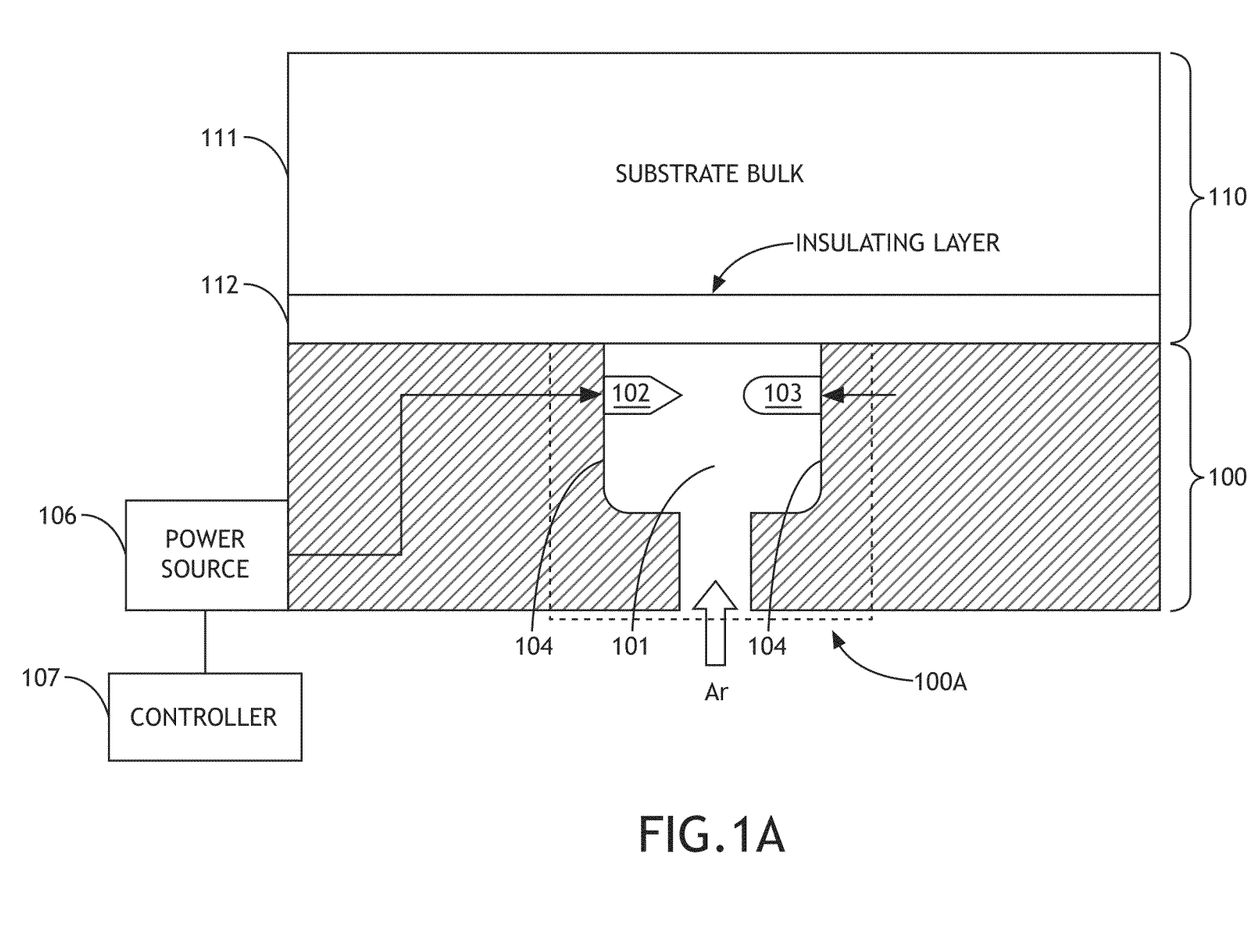
FIG. 1A shows a side cross-sectional view of a substrate positioned on a substrate tool in accordance with an embodiment of the present disclosure.
Figure 1B:
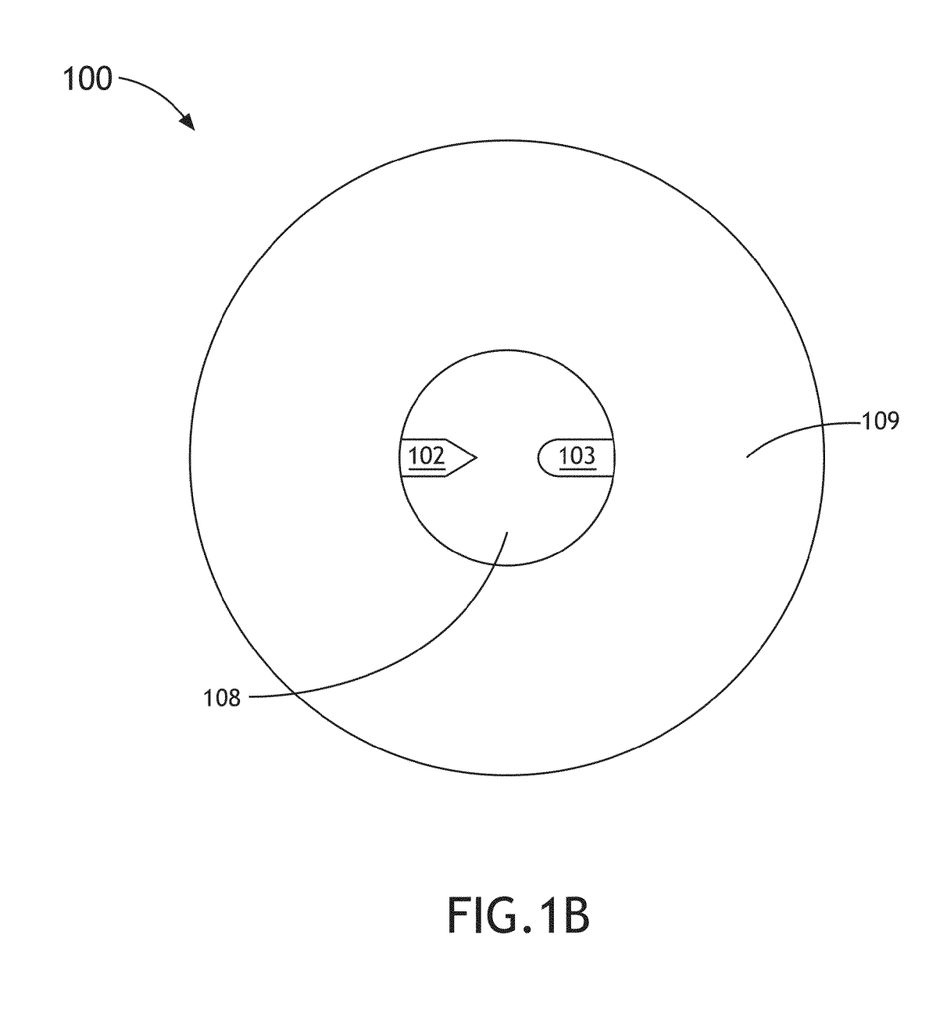
FIG. 1B shows a top view of the substrate tool in accordance with an embodiment of the present disclosure.

Referring now to FIGS. 1A, a side cross-sectional view of a substrate 110 positioned on (e.g., deposited on) a substrate tool 100 is shown, in accordance with one embodiment of the present disclosure. In some embodiments, the substrate 110 is a wafer (e.g., a silicon wafer). The substrate 110 may be composed of any suitable substrate material. In some embodiments, the substrate 100 may include a substrate bulk 111 (e.g., including any suitable material, such as silicon) and at least one insulating layer 112 (e.g., including any suitable insulating material, such as silicon dioxide (e.g., a backside oxide)). For example, the insulating layer 112 may be included (e.g., disposed) on one side of the substrate 110. By way of another example, insulating layers 112 may be included (e.g., disposed) on two sides of the substrate 110. In some embodiments, the substrate tool 100 may be a chuck or other wafer tool. In some embodiments, the substrate tool 100 may include a substrate support portion 109 (as shown in FIG. 1B), a plasma generation chamber 101, and at least two electrodes (e.g., 102, 103). In some embodiments, the substrate tool 100 includes or is coupled to a first power source 106 and a controller 107. In some embodiments, the substrate tool 100 is composed of one or combination of at least one conductive material or at least one non-conductive material.

Figure 1C:
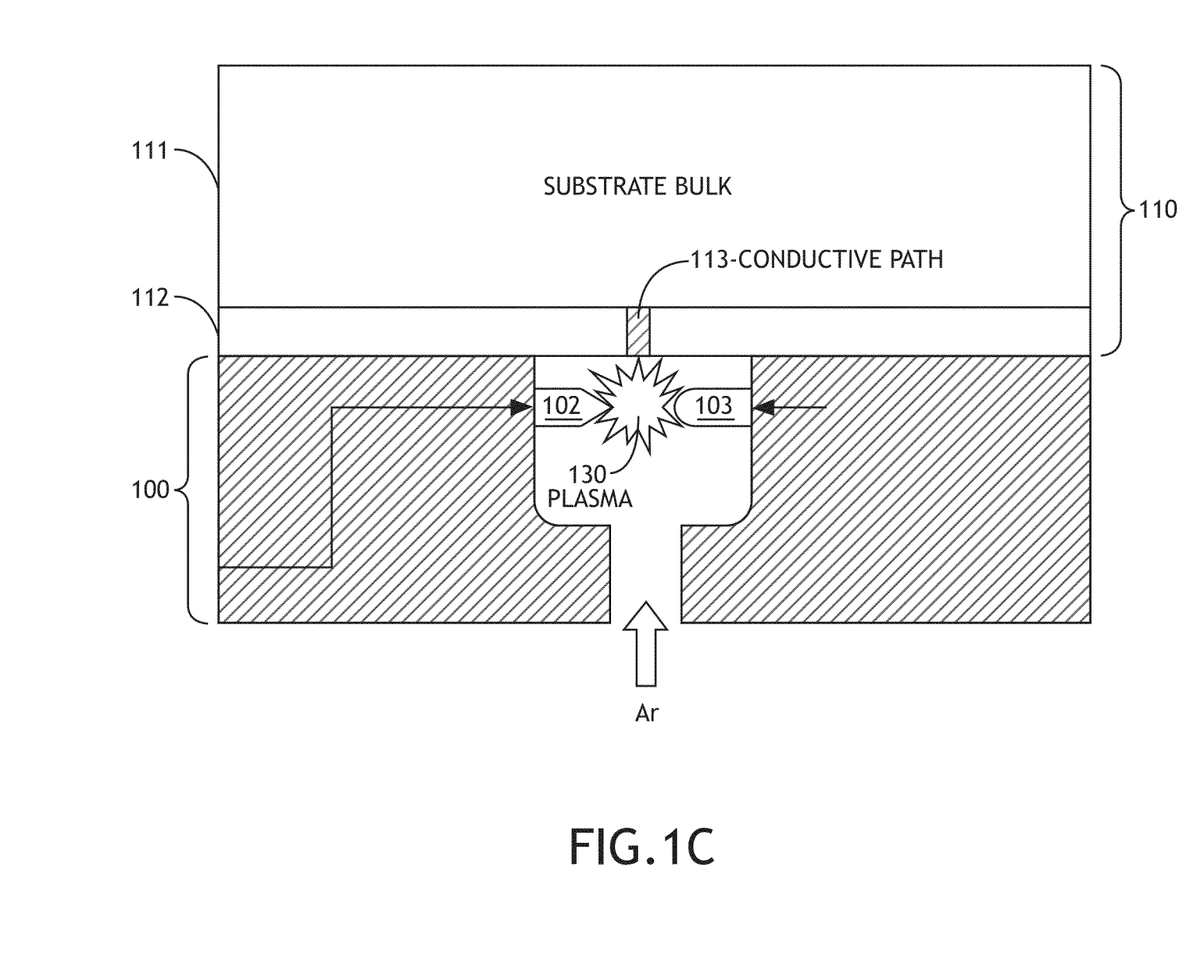
FIG. 1C shows a side cross-sectional view of the substrate tool and the substrate in accordance with an embodiment of the present disclosure.
Figure 2A:
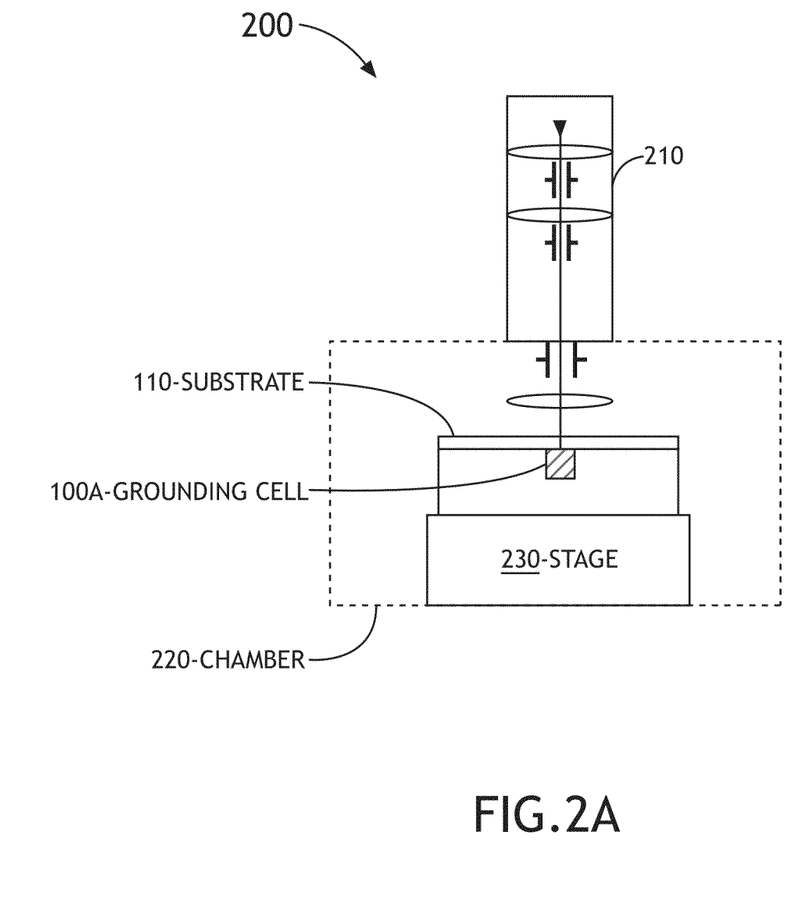
FIG. 2A shows a view of a system in accordance with an embodiment of the present disclosure.
Figure 2B:
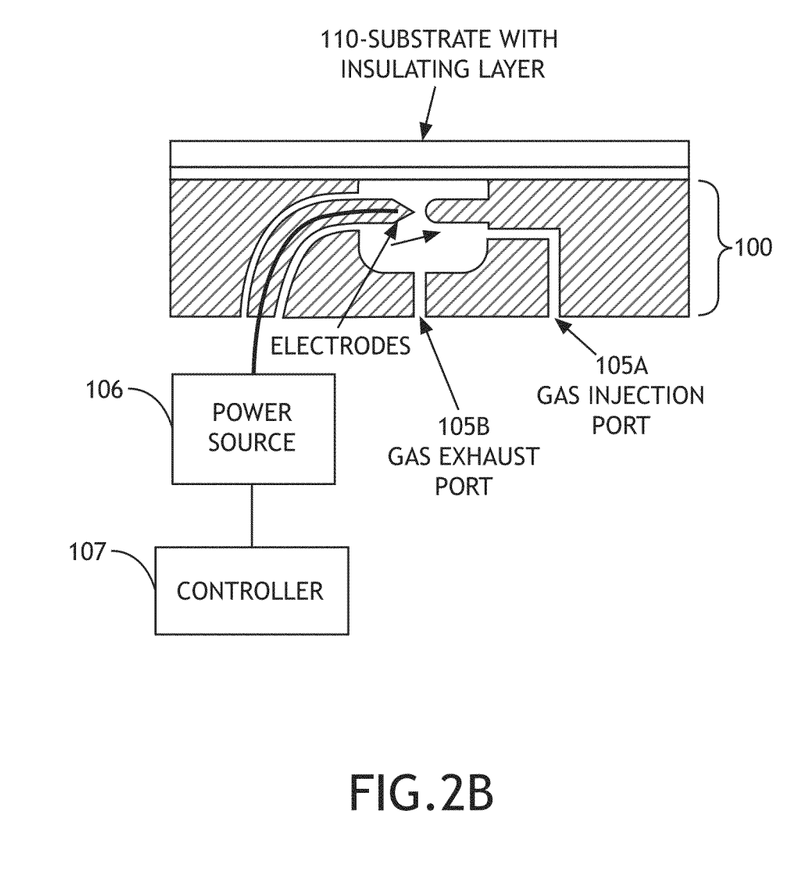
FIG. 2B shows a side cross-sectional view of a substrate tool in accordance with an embodiment of the present disclosure.

In some embodiments, the plasma generation chamber includes one or more chamber wall portions 104, at least one gas port (e.g., gas injection port 105A and gas exhaust port 105B, as shown in FIG. 2B), and a plasma application aperture 108. In some embodiments, the plasma generation chamber 101 is configured to contain or be supplied by a gas configured to produce (e.g., initiate and maintain) a plasma upon application of a voltage to a particular electrode of the at least two electrodes (e.g., 102, 103). In some embodiments, the plasma generation chamber 101 may include a single gas port configured to receive a gas; in other embodiments, the plasma generation chamber 101 may include multiple gas ports (e.g., gas injection port 105A and gas exhaust port 105B, as shown in FIG. 2B) such that gas may be supplied to the plasma generation chamber 101 through the gas injection port 105A such that gas may be purged from the plasma generation chamber 105B via the gas exhaust port 105B. Additionally, in a particular embodiment, when the substrate 110 is placed over the plasma application aperture 108, gas may be supplied through the gas injection port 105A and any surrounding gas, which may have entered the exposed plasma generation chamber while the plasma application aperture was exposed, may be purged from the plasma generation chamber 101 via the gas exhaust port 105B, may be exhausted and replaced with the gas suitable for producing a plasma (e.g., 130, as shown in FIG. 1C). In some embodiments, the plasma generation chamber 101 may be formed by any suitable configuration of chamber wall portions 104 and the plasma application aperture 108; for example, the chamber wall portions 104 may be configured in any suitable shape (e.g., substantially cylindrically shaped with a bottom wall portion (e.g., having a flat or curved shape) with the plasma application aperture 108 being an opening which is covered by the substrate 110; partially, substantially spherically shaped with the plasma application aperture 108 being an opening which is covered by the substrate 110; substantially parallel-piped shaped side wall portions with a bottom wall portion (e.g., having a flat or curved shape) with the plasma application aperture 108 being an opening which is covered by the substrate 110; or the like) such that the substrate 110 forms the top of the plasma generation chamber 101. In some embodiments, the plasma application aperture 108 is covered by a portion of the substrate 110 upon a deposition of the substrate 110 on the substrate support portion 109.

In some embodiments, the at least two electrodes (e.g., 102, 103) include a first electrode 102 and a second electrode 103. Each of the at least two electrodes may be composed of any suitable material. Each of the at least two electrodes may protrude into or extend into an interior portion of the plasma generation chamber. One or more of the at least two electrodes may have a pointed tip (e.g., first electrode 102), for example, to lower a breakdown threshold. One or more of the at least two electrodes may have a non-pointed tip (e.g., second electrode 103, shown with a rounded tip). In particular embodiments, one or more of the at least two electrodes may be adjusted by extending into or retracting from the chamber wall portions 104; for example, this allows the at least two electrodes to be adjusted to produce a plasma with suitable properties (e.g., size, intensity, or the like) for any of various gas attributes (e.g., pressure, mean free path, gas composition, or the like) of gas that may be present within the plasma generation chamber 101. In some embodiments, the at least two electrodes may be arranged in any suitable configuration and orientation. In embodiments, two of the at least two electrodes may be oppositely oriented; two of the at least two electrodes may be oriented substantially parallel to a plane of the substrate 110; and/or the like. In some embodiments, the first electrode 102 may be a negatively charged electrode (i.e., a cathode), and the second electrode 103 may be a grounded electrode; in other embodiments, the first electrode 102 may be a negatively charged electrode (i.e., a cathode), and the second electrode 103 may be a positively charged electrode (i.e., an anode).

In some embodiments, the substrate tool 100 includes or is associated with at least one power source, which may include a first power source 106. In some embodiments, the first power source 106 may be coupled to the first electrode 102. In some embodiments, the at least one power source may include a first power source 106 and a second power source (not shown), whereby the first power source 106 may be coupled to the first electrode 102 and the second power source may be coupled to the second electrode 103. In some embodiments, the first power source 106 may apply a voltage (e.g., a negatively charged voltage) to the first electrode 102. In embodiments including a first power source 106 and a second power source, the first power source 106 may apply a voltage (e.g., a negatively charged voltage) to the first electrode 102 and the second power source may apply an oppositely charged voltage to the second electrode 103. In some embodiments including the first power source 106, the first power source 106 applies a voltage the first electrode 102 of at least two electrodes of a plasma generation chamber filled with a low pressure gas (e.g., argon). Application of the voltage to the first electrode 102 may create a high electric field between a gap between the at least two electrodes (e.g., 102, 103). The high electric field in the gap may ionize some of the gas and may induce a breakdown, which leads to a large current flow and creates a plasma 130 (as shown in FIG. 1C). The plasma 130 generates a wide spectrum of light emission, which may, for example, extend into the deep ultraviolet (DUV) range. In some embodiments, deep ultraviolet photons may hit the insulating layer (e.g., backside oxide) of the substrate (e.g., a wafer) and may create charge carriers, which may form a conductive path 113 (as shown in FIG. 1C) through the insulating layer from the substrate bulk 111 to the plasma generation chamber-side of the insulating layer 112. Additionally, the plasma electrons and/or ions may carry current from the surface (e.g., of the plasma generation chamber-side) of the insulating layer 112 to a surrounding portion of the substrate tool 100 (e.g., a chuck), thus providing a low resistance path (e.g., conductive path 113) to hold the substrate bulk 111 voltage constant.

In some embodiments, the controller 107 is configured to control the at least one power source (e.g., 106). For example, the controller 107 may be configured for causing the power source to apply a particular voltage (e.g., a predetermined, determined, variable, or the like) to the first electrode 102, to cease application of the particular voltage, to adjust the particular voltage (e.g., increase or decrease the particular voltage), or the like. In another embodiment, the controller 107 may be configured to control other operations associated with the substrate tool 100. For example, the controller 107 may be configured for controlling gas flow (e.g., by controlling a control valve, compressor, and/or the like), controlling positioning of the substrate, or the like. In some embodiments, the controller 107 may be configured to execute instructions for performing operations, wherein the instructions may be stored in a non-transitory computer readable medium. In some embodiments, the controller 107 may be communicatively coupled to one or more computing devices associated with the substrate processing and/or inspection environment.

Referring now to FIG. 1B, a top view of the substrate tool 100 is shown, in accordance with one embodiment of the present disclosure. As shown in FIG. 1B, the topside of the substrate tool 100 may include a substrate support portion 109 configured to support a substrate 110. In one embodiment, the top side of the substrate tool 100 also includes a plasma application aperture 108 configured to expose the bottom surface of the insulation layer 112 to the plasma 130 generated in the plasma generation chamber 101. In one embodiment, the plasma application aperture 108 is configured to be covered by the substrate 110 when the substrate 100 is positioned over the substrate tool 100.

Referring now to FIG. 1C, a side cross-sectional view of the substrate tool 100 and the substrate 110, while plasma 130 is being generated, is shown, in accordance with one embodiment of the present disclosure. In some embodiments, application of the voltage to the first electrode 102 generates a plasma 130 within the plasma generation chamber 101, whereby generation of the plasma results in a non-destructive conductive path 113 through the insulating layer 112 of the substrate 110 between the plasma 130 and the substrate bulk 111. In some embodiments, a portion of the insulating layer 112 exposed by the plasma application aperture 108 is hit by both photons (e.g., visible spectrum photons, deep ultraviolet photons, or the like) and charge carriers while the plasma 130 is being generated such that the conductive path 113 is formed in the insulating layer 112. In some embodiments, the plasma 130 emits ultraviolet photons and extra ultraviolet (e.g., deep ultraviolet) photons. In a particular embodiment, where the gas is substantially pure argon, the plasma 130 may emit photons having wavelength lines of approximately 67 nanometers and 72 nanometers. In some embodiments, the plasma 130 is generated such that the top of the plasma has a distance of less than the mean free path of the gas from the bottom surface of the insulating layer 112, where the conductive path 113 is formed, such that the charge carriers and photons hit the insulating layer 112 with sufficient density and/or intensity to form the conductive path 113. In some embodiments, a distance between a tip of the first electrode 102 and the second electrode 103 is configured based at least on a particular voltage applied to the first electrode 102 and a mean free path of the gas at a given pressure. In some embodiments, a distance between a tip of the first electrode 102 and the second electrode 103 is between 0.1 millimeters and 10 millimeters (such as approximately 1.0 millimeter (+/−0.1 millimeter)). In some embodiments, a distance between the insulating layer 112 of the substrate 110 and the plasma 130 generated within the plasma generation chamber 101 is less than a mean free path of the gas at a particular pressure. Additionally, in some embodiments, a distance between the insulating layer of the substrate and a tip of the first electrode is less than twice a mean free path of the gas at a particular pressure. In a particular embodiment, the gas may be substantially pure argon having a low pressure (e.g., less than 0.1 millibars, such as approximately 0.05 millibars), and a distance between the insulating layer of the substrate and a tip of the first electrode is less than approximately 1.0 mm (e.g., +/−0.1 millimeter). While specific distances with respect to various suitable configurations of some embodiments have been described, one of ordinary skill in the art will appreciate various other suitable implementations which may be utilized with and adapted for various embodiments of the invention.

In another embodiment, the substrate tool 100 includes a mesh spanning the plasma application aperture; United States Patent Application No. US 2012/0298879, which discloses a flexible mesh electrical contact suitable for the mesh, inter alia, is incorporated by reference in its entirety.

Referring now to FIG. 2A, a view of a system 200 incorporating a grounding cell 100A of a substrate tool 100, as described previously herein, is shown, in accordance with one embodiment of the present disclosure. In some embodiments, the system 200 includes an electron-optical subsystem 210 (e.g., a scanning electron microscope), a substrate 110, a grounding cell 100A of a substrate tool 100 (as similarly, generally described with respect to substrate tool 100 of FIGS. 1A-C, above), a chamber 220, and a stage 230. In some embodiments, the electron-optical subsystem 210 includes a substrate inspection system configured to inspect the substrate 110. In one embodiment, the electron-optical subsystem includes a scanning electron microscope (SEM), which may include an SEM column. In other embodiments, the electron-optical subsystem 210 includes a lithography subsystem (e.g., an electron beam lithography subsystem, or the like) configured to etch the substrate 110. Additionally, in some embodiments, the electron-optical subsystem 210 includes an electron beam device (e.g., electron gun) configured to emit an electron beam onto the substrate 110.

Referring now to FIG. 2B, a side cross-sectional view of a grounding cell 100A of a substrate tool 100 of a particular embodiment is shown. In some embodiments, the substrate tool 100 may include a substrate grounding cell 100A configured to maintain a constant voltage in the substrate bulk 111 while a plasma 130 is generated within the plasma generation chamber 101. In some embodiments, one or more of the gas injection port 105A and the gas exhaust port 105B may include or be associated with one or more compressors (e.g., pump compressor, vacuum compressor, or the like) and/or gas sources (e.g., gas tank, or the like). In some embodiments, one or more of the gas injection port 105A and the gas exhaust port 105B may include or be associated with one or more valves (e.g., one-way valves, control valves (e.g., solenoid valves), or the like).

Figure 3:
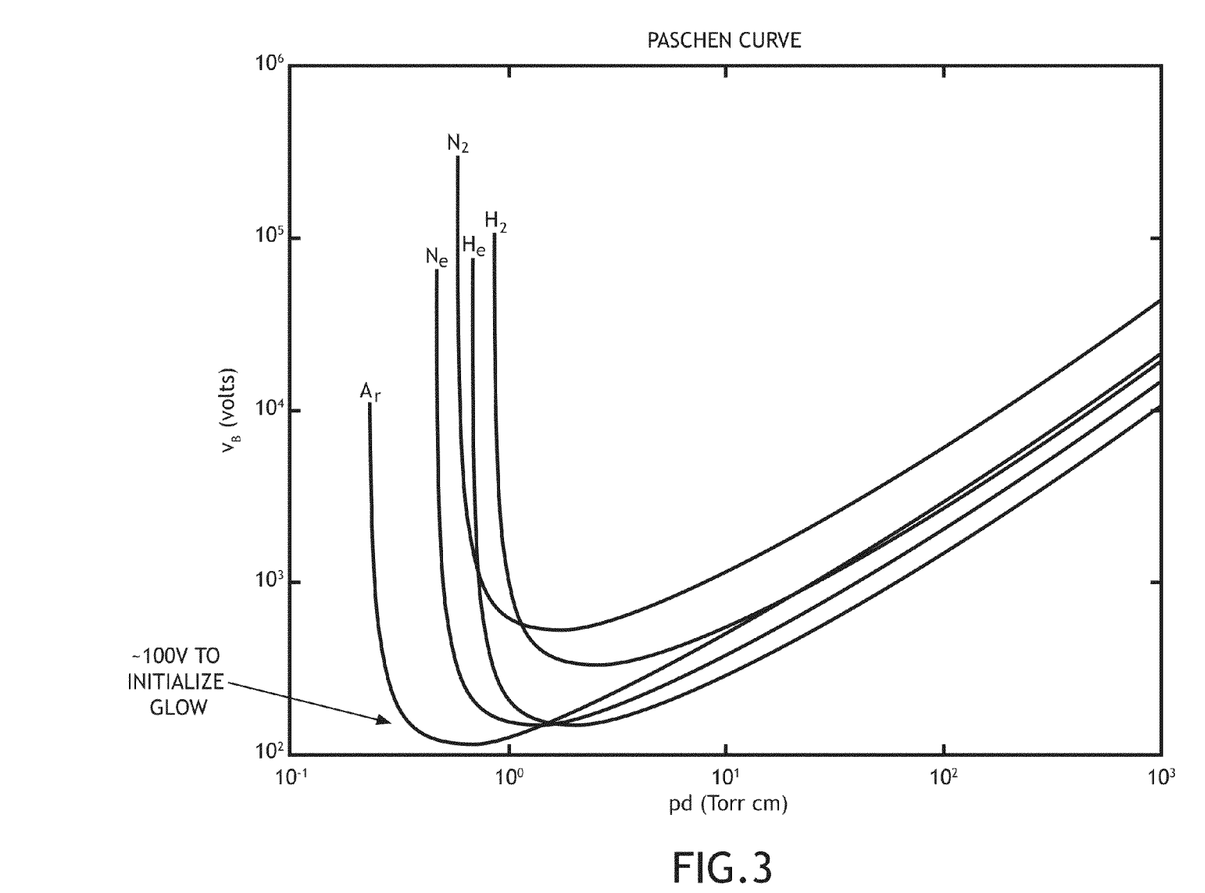
FIG. 3 shows an illustrative Paschen curve demonstrative of some embodiments of the present disclosure.

Referring now to FIG. 3, an illustrative Paschen curve demonstrative of some embodiments is shown. The Paschen curve shown in FIG. 3 shows a plot of the breakdown voltage (i.e., the voltage needed to start a discharge or electric arc) between two electrodes in a gas as a function of pressure and gap length. The plot shown in FIG. 3 depicts Paschen curves for helium, argon, neon, hydrogen, and nitrogen ($N_2$). For example, as determined by the plot, a breakdown voltage of approximately 100 volts (e.g., +/−10 volts) would initialize a plasma glow in argon gas having a pressure of approximately 0.05 millibars where the electrodes are spaced approximately 1 millimeter apart. While a specific breakdown voltage to initialize a plasma glow for a specific gas at a specific pressure in a specific electrode implementation with a specific distance between electrodes is described, one of ordinary skill in the art will appreciate any of various other implementations (which may have different gaseous compositions, different electrode configurations, different breakdown voltages, different pressures, or the like) may be suitably utilized with and adapted for embodiments of the invention.

Figure 4:
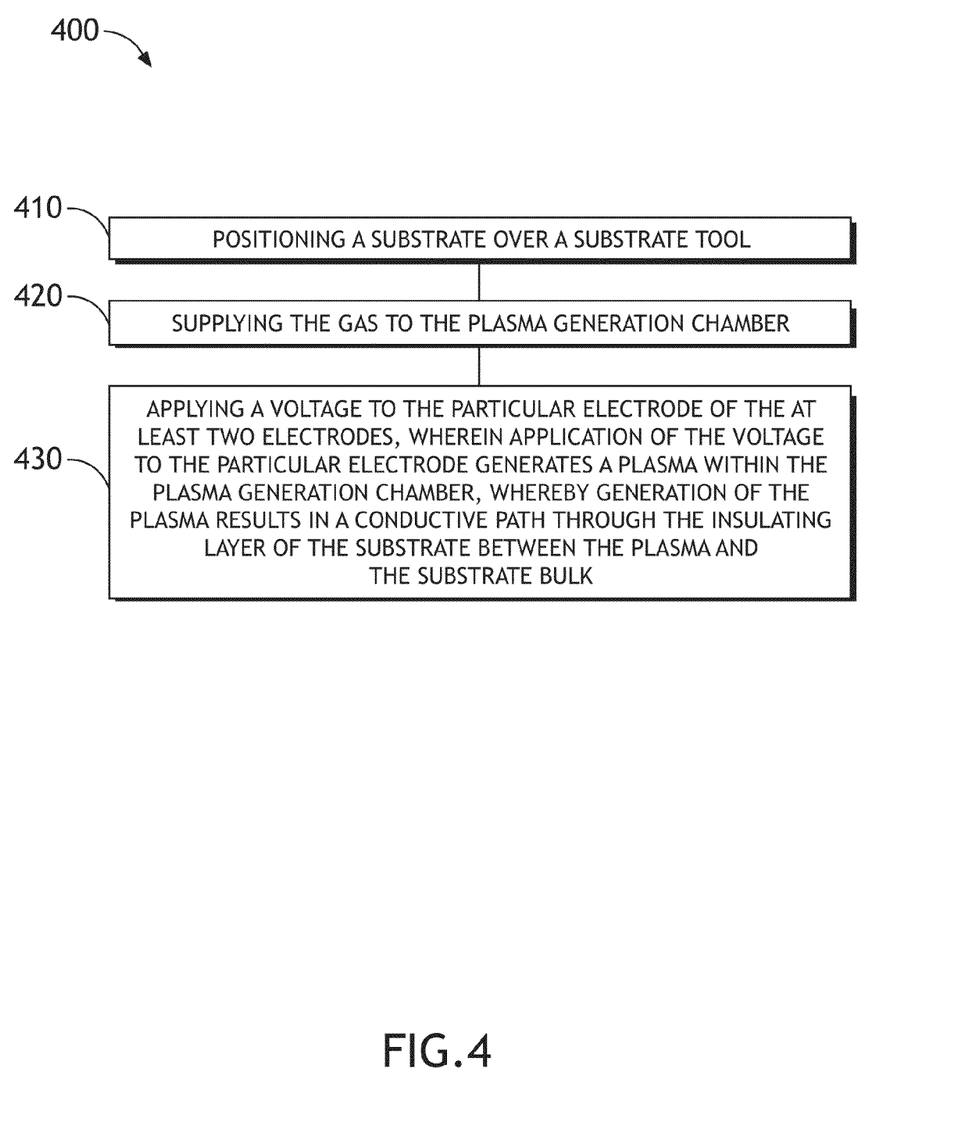
FIG. 4 shows a method for creating a non-destructive conductive path through an insulating layer of a substrate between plasma and a substrate bulk in accordance with an embodiment of the present disclosure.

Referring now to FIG. 4, a flow diagram of a method 400 for creating a non-destructive conductive path through an insulating layer of a substrate between plasma and a substrate bulk is shown, in accordance with one embodiment of the present disclosure. It is contemplated that embodiments of the method 400 can be performed, in whole or part, by or caused to be performed, in whole or part, by one or more of the following: an apparatus, a system, an apparati of a system, a sub-system of a system, a computing device; a controller 107; a power source 106; a compressor means; at least one component, integrated circuit, other controller, processor, or module of a computing device; software or firmware executed on a computing device; other computer components; or on other software, firmware, or middleware of a system topology. The method 400 can include any or all of steps 410, 420, and/or 430, and it is contemplated that the method 400 may include additional steps as disclosed throughout, but not explicitly set forth in this paragraph. Further, it is fully contemplated that the steps of the method 400 can be performed concurrently, sequentially, or in a non-sequential order. Likewise, it is fully contemplated that the method 400 can be performed prior to, concurrently, subsequent to, or in combination with the performance of one or more steps of one or more other methods or functionalities disclosed throughout.

Some embodiments of the method 400 include a step 410. Step 410 includes positioning a substrate over a substrate tool. Additionally, the step 410 may include positioning a substrate over a substrate tool, the substrate including at least one insulating layer and a substrate bulk, the substrate tool including a substrate support portion configured to support the substrate, a plasma generation chamber, at least two electrodes, and at least one power source, wherein the plasma generation chamber is comprised of chamber wall portions, at least one gas port, and a plasma application aperture, wherein the plasma application aperture is covered by a portion of the substrate, wherein the plasma generation chamber is configured to contain a gas, wherein the at least two electrodes include a first electrode and a second electrode, each of the at least two electrodes protruding into or extending into an interior portion of the plasma generation chamber, wherein the at least one power source includes at least a first power source, the first power source being coupled to a particular electrode of the at least two electrodes.

Some embodiments of the method 400 include a step 420. Step 420 includes supplying the gas to the plasma generation chamber.

Some embodiments of the method 400 include a step 430. Step 430 includes applying a voltage to the particular electrode of the at least two electrodes, wherein application of the voltage to the particular electrode generates a plasma within the plasma generation chamber, whereby generation of the plasma results in a conductive path through the insulating layer of the substrate between the plasma and the substrate bulk.

Some embodiments of the method 400 include one or more additional steps. For example, some embodiments of the method 400 may include one or more of the following: ceasing to apply voltage to the particular electrode; maintaining a substantially constant voltage in the substrate bulk during application of the voltage to the particular electrode of the at least two electrodes; exhausting at least a portion of the gas from the plasma generation chamber; performing an operation on the substrate during application of the voltage to the particular electrode of the at least two electrodes; inspecting the substrate during application of the voltage to the particular electrode of the at least two electrodes; emitting an electron beam on to the substrate during application of the voltage to the particular electrode of the at least two electrodes; and/or performing a lithography operation on the substrate during application of the voltage to the particular electrode of the at least two electrodes.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the disclosed subject matter. The accompanying claims may present elements of the various steps in a sample order, and are not necessarily meant to be limited to the specific order or hierarchy presented.

Embodiments of the invention may also be implemented by or in the form of integrated circuits. In a given such integrated circuit implementation, identical die are typically formed in a repeated pattern on a surface of a semiconductor wafer. Each die includes, for example, at least a portion of signal processing circuitry as described herein, and may further include other structures or circuits. The individual die are cut or diced from the wafer, then packaged as an integrated circuit. One skilled in the art would know how to dice wafers and package die to produce integrated circuits. Integrated circuits so manufactured are considered embodiments of the invention.

It is believed that embodiments of the present disclosure and many of its attendant advantages will be understood by the foregoing description, and it will be apparent that various changes can be made in the form, construction, and arrangement of the components thereof without departing from the scope and spirit of the disclosure or without sacrificing all of its material advantages. The form herein before described being merely an explanatory embodiment thereof, it is the intention of the following claims to encompass and include such changes.

What is claimed is:

1. An apparatus, comprising:
   a substrate support portion configured to support a substrate including at least one insulating layer and a substrate bulk;

a plasma generation chamber, the plasma generation chamber being comprised of chamber wall portions, at least one gas port, and a plasma application aperture, wherein the plasma application aperture is covered by a portion of the substrate upon a deposition of the substrate on the substrate support portion, wherein the plasma generation chamber is configured to contain a gas;

at least two electrodes including a first electrode and a second electrode, each of the at least two electrodes protruding into or extending into an interior portion of the plasma generation chamber; and at least one power source including at least a first power source, the first power source being coupled to a particular electrode of the at least two electrodes, the first power source being configured to apply a voltage to the particular electrode of the at least two electrodes, wherein application of the voltage to the particular electrode generates a plasma within the plasma generation chamber, whereby generation of the plasma results in a conductive path through the insulating layer of the substrate between the plasma and the substrate bulk.

2. The apparatus of claim 1, wherein application of the voltage to the first electrode generates the plasma within the plasma generation chamber, whereby generation of the plasma results in a non-destructive conductive path through the insulating layer of the substrate between the plasma and the substrate bulk.

3. The apparatus of claim 1, wherein the first electrode is coupled to the first power source and the second electrode is a ground.

4. The apparatus of claim 1, wherein one or more of the at least two electrodes has a pointed tip.

5. The apparatus of claim 1, wherein one or more of the at least two electrodes has a non-pointed tip.

6. The apparatus of claim 1, wherein one or more of the at least two electrodes is configured to be adjustably extended into or adjustably retracted from the chamber wall portions.

7. The apparatus of claim 1, wherein two of the at least two electrodes are oppositely oriented.

8. The apparatus of claim 1, wherein two of the at least two electrodes are oriented substantially parallel to a plane of the substrate.

9. The apparatus of claim 1, wherein the gas is comprised of at least one inert gas.

10. The apparatus of claim 1, wherein the gas is comprised of at least one noble gas.

11. The apparatus of claim 10, wherein the at least one noble gas includes argon.

12. The apparatus of claim 1, wherein the gas is comprised of at least one inert gas and at least one non-inert gas.

13. The apparatus of claim 1, further comprising:
a compressor means configured to supply the gas into the plasma generation chamber.

14. The apparatus of claim 1, wherein the at least one gas port of the plasma generation chamber comprises two gas ports including a supply gas port and an exhaust gas port, the supply gas port being configured to provide an inflow of the gas into the plasma generation chamber, the exhaust port being configured to provide an outflow of the gas from the plasma generation chamber.

15. The apparatus of claim 1, wherein a distance between a tip of the first electrode and a tip of the second electrode is based at least on a particular voltage applied to the first electrode and a mean free path of the gas at a particular pressure.

16. The apparatus of claim 1, wherein a distance between a tip of the first electrode and a tip of the second electrode is between 0.1 millimeters and 10 millimeters.

17. The apparatus of claim 1, wherein a distance between a tip of the first electrode and a tip of the second electrode is approximately 1.0 millimeter.

18. The apparatus of claim 1, wherein a distance between the insulating layer of the substrate and the plasma generated within the plasma generation chamber is less than a mean free path of the gas at a particular pressure.

19. The apparatus of claim 1, wherein a distance between the insulating layer of the substrate and a tip of the first electrode is less than twice a mean free path of the gas at a particular pressure.

20. The apparatus of claim 1, further comprising:
a mesh spanning the plasma application aperture.

21. The apparatus of claim 1, further comprising a pump means configured to supply the gas into the plasma generation chamber.

22. A system, comprising:
a substrate including at least one insulating layer and a substrate bulk;
an electron-optical subsystem; and
a substrate tool, comprising:
a substrate support portion supporting the substrate;
a plasma generation chamber, the plasma generation chamber being comprised of chamber wall portions, at least one gas port, and a plasma application aperture, wherein the plasma application aperture is covered by a portion of the substrate, wherein the plasma generation chamber is configured to contain a gas;
at least two electrodes including a first electrode and a second electrode, each of the at least two electrodes protruding into or extending into an interior portion of the plasma generation chamber; and
at least one power source including at least a first power source, the first power source being coupled to a particular electrode of the at least two electrodes, the first power source being configured to apply a voltage to the particular electrode of the at least two electrodes,
wherein application of the voltage to the particular electrode generates a plasma within the plasma generation chamber, whereby generation of the plasma results in a conductive path through the insulating layer of the substrate between the plasma and the substrate bulk.

23. The system of claim 22, wherein the electron-optical subsystem comprises a substrate inspection subsystem configured to inspect the substrate.

24. The system of claim 22, wherein the electron-optical subsystem includes a scanning electron microscope subsystem.

25. The system of claim 22, wherein the electron-optical subsystem comprises a lithography subsystem.

26. The system of claim 25, wherein lithography subsystem comprises an electron-beam lithography subsystem.

27. The system of claim 22, wherein the electron-optical subsystem includes an electron beam device.

28. A method for creating a non-destructive conductive path through an insulating layer of a substrate between plasma and a substrate bulk, the method comprising:
positioning a substrate over a substrate tool, the substrate including at least one insulating layer and a substrate bulk, the substrate tool including a substrate support portion configured to support the substrate, a plasma generation chamber, at least two electrodes, and at least one power source, wherein the plasma generation chamber is comprised of chamber wall portions, at least one gas port, and a plasma application aperture, wherein the plasma application aperture is covered by a portion of the substrate, wherein the plasma generation chamber is configured to contain a gas, wherein the at least two electrodes include a first electrode and a second electrode, each of the at least two electrodes protruding into or extending into an interior portion of the plasma generation chamber, wherein the at least one power source includes at least a first power source, the first power source being coupled to a particular electrode of the at least two electrodes;

supplying the gas to the plasma generation chamber; and applying a voltage to the particular electrode of the at least two electrodes, wherein application of the voltage to the particular electrode generates a plasma within the plasma generation chamber, whereby generation of the plasma results in a conductive path through the insulating layer of the substrate between the plasma and the substrate bulk.

29. The method of claim 28, further comprising:
ceasing to apply voltage to the particular electrode.

30. The method of claim 28, further comprising:
maintaining a substantially constant voltage in the substrate bulk during application of the voltage to the particular electrode of the at least two electrodes.

31. The method of claim 28, further comprising:
exhausting at least a portion of the gas from the plasma generation chamber.

32. The method of claim 28, further comprising:
performing an operation on the substrate during application of the voltage to the particular electrode of the at least two electrodes.

33. The method of claim 32, wherein performing an operation on the substrate during application of the voltage to the particular electrode of the at least two electrodes further comprises:
inspecting the substrate during application of the voltage to the particular electrode of the at least two electrodes.

34. The method of claim 32, wherein performing an operation on the substrate during application of the voltage to the particular electrode of the at least two electrodes further comprises:
emitting an electron beam on to the substrate during application of the voltage to the particular electrode of the at least two electrodes.

35. The method of claim 32, wherein performing an operation on the substrate during application of the voltage to the particular electrode of the at least two electrodes further comprises:
performing a lithography operation on the substrate during application of the voltage to the particular electrode of the at least two electrodes.

* * * * *